United States Patent
Robertson et al.

(10) Patent No.: US 6,998,933 B1
(45) Date of Patent: Feb. 14, 2006

(54) MILLIMETER WAVE SWITCH

(75) Inventors: Adam E. Robertson, Rohnert Park, CA (US); Lon A. Dearden, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 21 days.

(21) Appl. No.: 10/910,414

(22) Filed: Aug. 3, 2004

(51) Int. Cl.
*H01P 1/10* (2006.01)
*H01P 5/12* (2006.01)

(52) U.S. Cl. ..................... 333/101; 333/104
(58) Field of Classification Search ........... 333/101, 333/103, 104, 262; 455/424, 101
See application file for complete search history.

(56) References Cited

U.S. PATENT DOCUMENTS

| | | | |
|---|---|---|---|
| 4,185,258 A | 1/1980 | Cote et al. | |
| 6,236,841 B1 * | 5/2001 | Akiya | ............ 455/91 |
| 6,310,508 B1 | 10/2001 | Westerman | |
| 6,552,626 B1 | 4/2003 | Sharpe et al. | |
| 6,633,206 B1 | 10/2003 | Kato | |
| 6,690,952 B1 * | 2/2004 | Nishimori et al. | ....... 455/562.1 |
| 6,847,829 B1 * | 1/2005 | Tanaka et al. | ........... 455/552.1 |

* cited by examiner

*Primary Examiner*—Dean Takaoka

(57) ABSTRACT

A switch selectively provides one of a first input signal at a first frequency and a second input signal at a second frequency to an output terminal with low insertion loss and high isolation between the first and second input signals. The first input signal is received at a first input terminal and the second input signal is received at a second input terminal. A switching element electrically connects the first input terminal and the output terminal to provide the first input signal to the output terminal in a first state and isolates the first input terminal from the output terminal in a second state. A bias line is electrically connected to provide a control signal to the switching element to select between the first state and the second state. An AC coupled transmission line is electrically connected to the second input terminal and electrically connected between the switching element and the output terminal. The control signal is provided through the AC coupled transmission line when the switching element is in the first state to isolate the second input terminal from the output terminal and provide the first input signal to the output terminal. The second input signal is provided DC coupled to the output terminal through the AC coupled transmission line when the switching element is in the second state.

30 Claims, 3 Drawing Sheets

MILLIMETER WAVE SWITCH

BACKGROUND OF THE INVENTION

Switches have long been used in electrical circuit designs to isolate a portion of an electrical circuit. In its simplest form, a switch operates to allow a signal to pass from an input terminal to an output terminal in a "closed" position and to prevent the signal from passing from the input terminal to the output terminal in an "open" position.

In the microwave and mm-wave frequency range, switches are used in instrumentation, communications, radar, fiber optic and many other systems that require high-frequency switching. For example, a switch can be used for pulse modulation, port isolation, transfer switching, high-speed switching, replacement of mechanical parts and other switch applications.

There a number of commercially available high-frequency switches on the market today. However, these switches have all failed to simultaneously obtain high switch isolation greater than 15 dBm, high power handling above 24 dBm and low insertion loss of a fraction of a dB from DC to mm-wave frequencies. For example, high-frequency switches employing field-effect transistors (FETs) typically are unable to handle high frequencies in the mm-wave range and/or high power above 24 dBm. In the alternative, FET-based solutions may have high insertion loss. In addition, waveguide-based switches are difficult to integrate and lack the required bandwidth coverage to DC. Furthermore, coupling-based diplexers typically have poor isolation and high insertion loss at the cross-over frequency.

Therefore, what is needed is a switch capable of achieving high switch isolation, high power handling and low insertion loss from DC to mm-wave frequencies.

SUMMARY OF THE INVENTION

Embodiments of the present invention provide a switch for selectively providing one of a first input signal at a first frequency and a second input signal at a second frequency to an output terminal. The first input signal is received at a first input terminal and the second input signal is received at a second input terminal. A switching element electrically connects the first input terminal and the output terminal to provide the first input signal to the output terminal in a first state and isolates the first input terminal from the output terminal in a second state. A bias line is electrically connected to provide a control signal to the switching element to select between the first state and the second state. An AC coupled transmission line is electrically connected to the second input terminal and electrically connected between the switching element and the output terminal. The control signal is provided through the AC coupled transmission line when the switching element is in the first state to isolate the second input terminal from the output terminal and provide the first input signal to the output terminal. The second input signal is provided DC coupled to the output terminal through the AC coupled transmission line when the switching element is in the second state.

In one embodiment, the switching element is a series switching element and a shunt switching element is connected to the AC coupled transmission line. The control signal is provided to the shunt switching element through the AC coupled transmission line when the series switching element is in the first state to isolate the second input terminal from the output terminal and provide the first input signal to the output terminal through the AC coupled transmission line. The shunt switching element is separated from the AC coupled transmission line by a distance less than or equal to 70 μm. However, it should be understood that in other embodiments, the separation distance is designed to maintain sufficient isolation. In a further embodiment, the shunt switching element includes two shunt switching elements. A first shunt switching element is connected to a first portion of the AC coupled transmission line connected between the series switching element and ground through the first shunt switching element and a second shunt switching element is connected to a second portion of the AC coupled transmission line connected between the output terminal and the second input terminal.

In another embodiment, the AC coupled transmission line is a capacitive element having a first plate and a second plate separated by a dielectric. The first plate is formed of a first metal layer and the second metal plate is formed of a second metal layer. In a further embodiment, the AC coupled transmission line is a quarter wavelength transmission line to make the shunt switching element appear as an open circuit to the first input signal and a short circuit to the second input signal. In still a further embodiment, the first input signal is at a first frequency greater than or equal to 20 GHz and the second input signal is at a second frequency between DC and 20 GHz.

Advantageously, embodiments of the present invention uses a simplistic biasing scheme by using a single bias line for all switching elements and biasing the shunt switching elements through the second metal layer of the AC coupled transmission line. In addition, the power handling of the switch is improved to at least 33 dBm when using PIN diodes. Moreover, low insertion loss and high isolation is achieved by placing the shunt switching elements as close as possible to the AC coupled transmission line. Likewise, improved isolation is achieved by using two shunt switching elements on either side of the AC coupled transmission line. Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which show exemplary embodiments of the invention and which are incorporated in the specification hereof by reference, wherein.

DETAILED DESCRIPTION OF THE EXEMPLARY EMBODIMENTS

Figure 1:
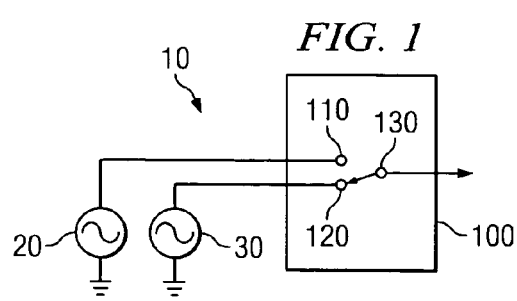
FIG. 1 is a block diagram of an exemplary DC to mm-wave frequency switch, in accordance with embodiments of the present invention.

FIG. 1 is a block diagram of an exemplary DC to mm-wave frequency switch 100, in accordance with embodiments of the present invention. The switch 100 is a part of a switching system 10. For example, in one embodiment, switching system 10 can be an output switch of a 44 GHz up-converter. System 10 includes two signal sources 20 and 30. A first signal source 20 supplies a first signal at a first frequency to a first input terminal 110 of switch 100. A second signal source 30 supplies a second signal at a second frequency to a second input terminal 120 of switch 100. Switch 100 selectively provides the first signal or the second signal to an output terminal 130 of switch 100. In one embodiment, the first frequency is a high frequency greater than or equal 20 GHz and the second frequency is a low frequency between DC and 20 GHz. However, it should be understood that in other embodiments, the first and second frequencies can be any two frequencies from which switch 100 selects.

Figure 2:
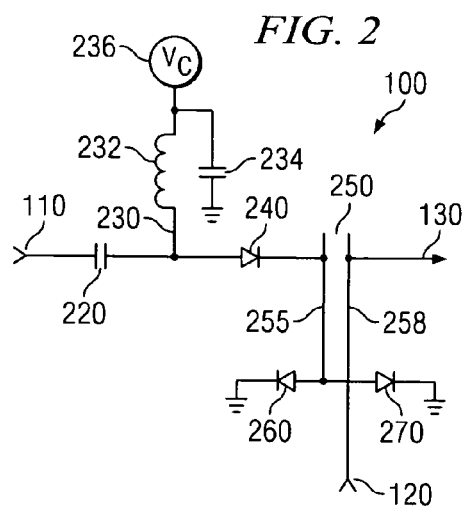
FIG. 2 is a schematic diagram of an exemplary DC to mm-wave frequency switch, in accordance with embodiments of the present invention.

FIG. 2 is a schematic diagram of an exemplary DC to mm-wave frequency switch 100, in accordance with embodiments of the present invention. Switch 100 includes input terminals 110 and 120 and output terminal 130. A series switching element 240 is connected to first input terminal 110. Series switching element 240 is shown as a single PIN diode. However, it should be understood that in other embodiments, additional PIN diodes can be added to form series switching element 240. In addition, it should be understood that other circuit elements can be used as series switching element 240. For example, series switching element 240 can include one or more P-N diodes, Schottky diodes, field-effect transistors (FETs), PNP transistors, NPN transistors or any other type of circuit element.

In FIG. 2, the anode of diode 240 is electrically connected to first input terminal 110 via a capacitor 220. The anode of diode 240 is further connected to a bias line 230. Bias line 230 is connected to the end of bias choke 232, which in turn is connected to a bias controller (Vc) 236 that provides a control signal to bias diode 240. In one embodiment, bias line 230 includes a quarter wavelength transmission line segment. Capacitors 220 and 234 serve to block DC potentials that are applied via bias line 230 to bias diode 240 into its conducting or non-conducting states in a manner well-known in the art. Capacitor 234 further provides an AC short circuit to ground at radio frequencies.

The cathode of diode 240 is electrically connected to output terminal 130 via an AC coupled transmission line 250. AC coupled transmission line 250 is a capacitive element formed of two capacitive plates 255 and 258, each having a length of a quarter wavelength. Plate 255 is connected between series switching element (series diode) 240 and two shunt switching elements (shunt diodes) 260 and 270. It should be understood that as discussed above in connection with series switching element 240, other circuit elements can be used as shunt switching elements 260 and 270. In addition, in other embodiments, a single shunt diode 260 or 270 can be used instead of two shunt diodes 260 and 270. Plate 258 is connected between second input terminal 120 and output terminal 130. In one embodiment, as described in more detail below in connection with FIGS. 5 and 6, AC coupled transmission line 250 is formed of two metal layers (capacitive plates 255 and 258) separated by a dielectric to prevent DC frequencies from passing between capacitive plates 255 and 258, while allowing high frequencies (e.g., radio and microwave frequencies) to pass therebetween.

When bias controller 236 provides a positive bias potential, capacitors 220 and 234 block direct current, which enables a forward bias voltage to be applied to series diode 240 and shunt diodes 260 and 270 through AC coupled transmission line 250. As a result of the forward bias voltage, series diode 240 and shunt diodes 260 and 270 switch to a conducting or "ON" state. Therefore, a signal entering from first input terminal 110 passes through capacitor 220, diode 240 and AC coupled transmission line 250 to output terminal 130.

When bias controller 236 provides a negative bias potential or zero bias potential, a reverse bias voltage or zero voltage is applied to series diode 240, which in turn causes zero voltage to be applied to shunt diodes 260 and 270. As a result of the reverse bias voltage and/or zero voltage, series diode 240 and shunt diodes 260 and 270 switch to a non-conducting or "OFF" state. Therefore, a signal entering from second input terminal 120 passes through AC coupled transmission line 250 to output terminal 130.

Figure 3A:
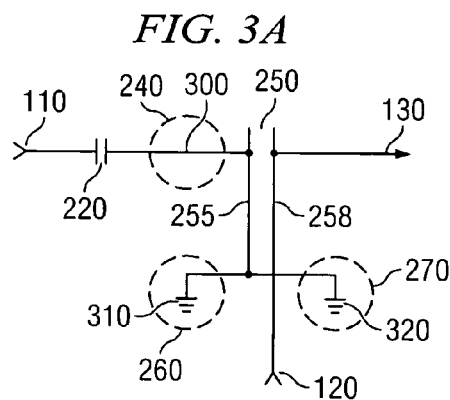
FIG. 3A is a schematic diagram of a circuit model for the switch in a forward bias condition.

The operation of switch 100 is explained in more detail with reference to FIGS. 3A and 3B. FIG. 3A is a schematic diagram of a circuit model for switch 100 in a forward bias condition. In the forward bias condition, the circuit equivalent of series diode 240 is a transmission line 300 and the circuit equivalent of shunt diodes 260 and 270 are grounds 310 and 320. A first input signal entering switch 100 from first input terminal 110 travels through capacitor 220 and series diode 240 (transmission line 300) to AC coupled transmission line 250. Thereafter, the first input signal travels through AC coupled transmission line 250 to output terminal 130.

At high frequencies (e.g., radio and microwave frequencies), with a quarter wavelength length for the AC coupled transmission line 250, shunt switching elements 260 and 270 appear as open circuits (not specifically illustrated) to the first input signal and short circuits to grounds 310 and 320 to a second input signal entering switch 100 from second input terminal 120. Thus, at high frequencies, any portion of the first input signal traveling down either plate 255 or 258 of AC coupled transmission line 250 will be reflected back up AC coupled transmission line 250 to output terminal 130, and the second signal will be provided to grounds 310 and 320. Thus, when shunt diodes 260 and 270 are forward biased, second input terminal 120 is isolated from output terminal 130 at high frequencies to prevent the second input signal from traveling up the second plate 258 of AC coupled transmission line 250 to output terminal 130. However, at DC, there is no isolation between second input terminal 120 and output terminal 130.

Figure 3B:
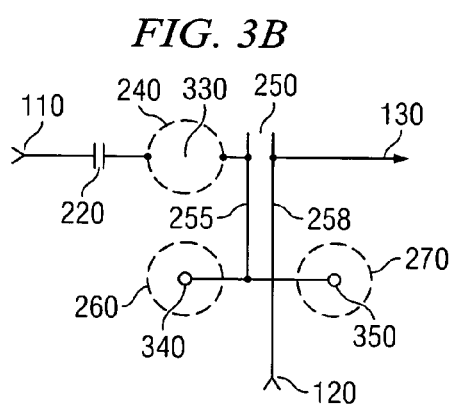
FIG. 3B is a schematic diagram of a circuit model for the switch in a zero bias or reverse bias condition.

FIG. 3B is a schematic diagram of a circuit model for switch 100 in a zero bias or reverse bias condition. In the reverse bias or zero bias condition, the circuits equivalent of series diode 240 and shunt diodes 260 and 270 are open circuits 330, 340 and 350, respectively. A first input signal entering switch 100 from first input terminal 110 travels through capacitor 220 and is blocked by open circuit 330 created by series diode 240. Thus, when series diode 240 is reverse-biased or zero-biased, first input terminal 110 is isolated from output terminal 130 to prevent the first input signal from reaching output terminal 130.

A second input signal entering switch 100 from second input terminal 120 travels up second plate 258 of AC coupled switching element 250 to output terminal 130. Since series switching element 240 and shunt switching elements 260 and 270 appear as open circuits 330, 340 and 350, respectively, to the second input signal, at high frequencies, any portion of the second input signal passing from second plate 258 to first plate 255 of AC coupled transmission line 250 will be reflected back to second plate 258 of AC coupled transmission line 250 to output terminal 130. It should be understood that at DC, the second input signal travels through second plate 258 of AC coupled transmission line 250 to output terminal 130 as DC frequencies are not able to pass from second plate 258 to first plate 255.

Figure 4:
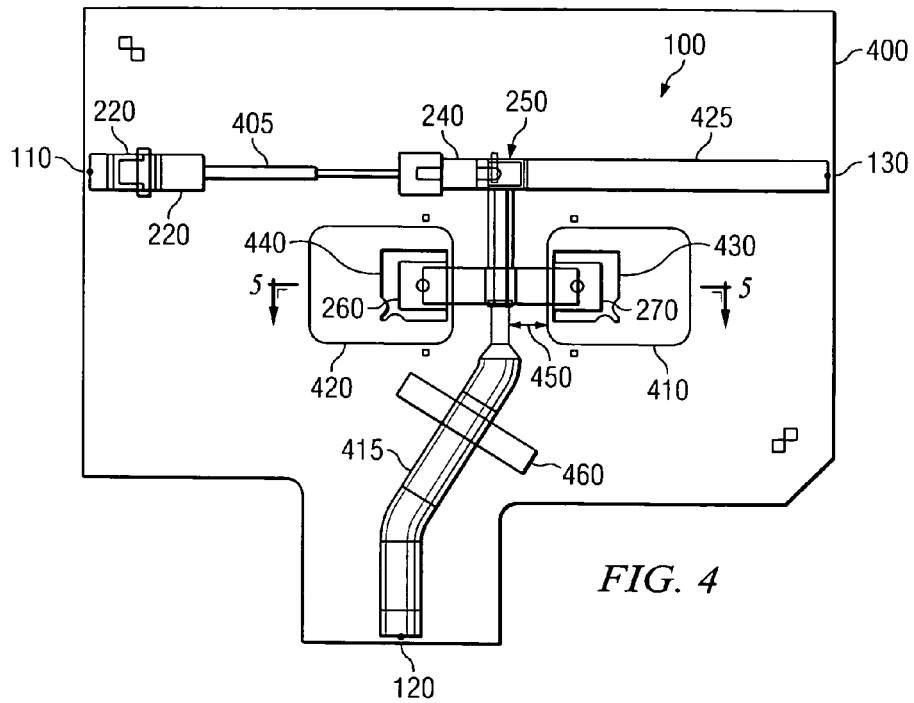
FIG. 4 is a circuit layout of the switch, in accordance with embodiments of the present invention.

FIG. 4 is a thin film circuit layout 400 of switch 100, in accordance with embodiments of the present invention. A first input signal entering switch 100 at first input terminal 110 travels through capacitor 220 and microstrip conductors, shown generally at 405, to series diode 240. When series diode 240 is forward biased, the first input signal travels through AC coupled transmission line 250 and microstrip conductors, shown generally at 425, to output terminal 130. A second input signal entering switch 100 at second input terminal 120 travels through microstrip conductors, shown generally at 415, and low pass filter 460 to AC coupled transmission line 250. Low pass filter 460 is a filter that passes 20 GHz and provides greater isolation. When shunt diodes 260 and 270 are forward biased, at high frequencies, the second input signal is prevented from traveling through AC coupled transmission line 250. When shunt diodes 260 and 270 are reverse biased or zero biased, the second input signal travels through AC coupled transmission line 250 and microstrip conductors 425 to output terminal 130.

Diodes 260 and 270 are formed in thin film cutouts 410 and 420, respectively, where the thin film is removed. In one embodiment, to make diodes 260 and 270 quasi-planar with the surface of the thin film, diodes 260 and 270 are placed above shims 430 and 440, respectively. Thin film cutouts 410 and 420 can be formed, for example, using a laser. However, lasers have a finite width, and as a result, can damage the surface of other materials, such as AC coupled transmission line 250. Therefore, each cutout 410 and 420 is separated from AC coupled transmission line 250 by a minimum distance 450. In one embodiment distance 450 is approximately 70 μm. However, in other embodiments, distance 450 can be less than 70 μm. Since the insertion loss and isolation of switch 100 are proportional to distance 450, it is desirable to have distance 450 as small as possible.

Figure 5:
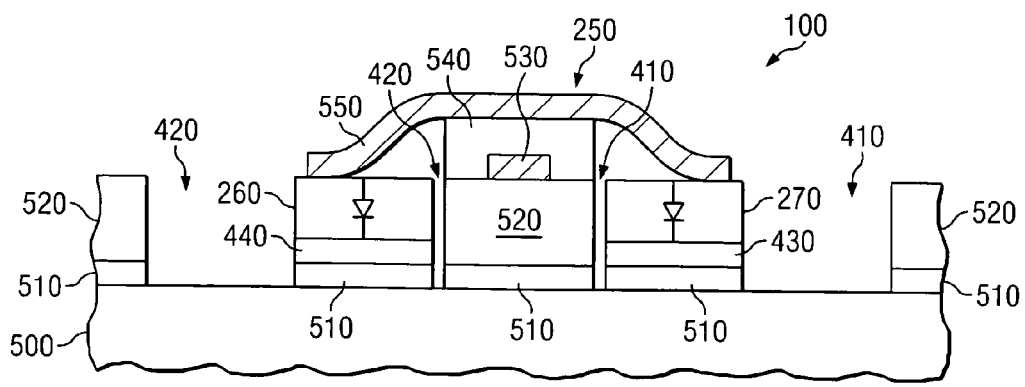
FIG. 5 is a cross-sectional view of the switch of FIG. 4, in accordance with one embodiment of the present invention.

FIG. 5 is a cross-sectional view of the switch of FIG. 4, in accordance with one embodiment of the present invention. FIG. 5 illustrates a die-attach assembly technique for switch 100. A conductive adhesive 510, such as epoxy or solder, is formed above an electrically conductive surface 500. The electrically conductive surface 500 forms a DC and RF ground plane for switch 100. For example, in one embodiment, surface 500 is formed of copper or other conductive metal. A thin film 520 is formed above conductive adhesive 510, and cutouts 410 and 420 are made in thin film 520 where diodes 260 and 270 are attached. Metal shims 430 and 440 are placed above conductive adhesive 510 in cutouts 410 and 420, respectively, and diodes 260 and 270 are attached to metal shims 430 and 440, respectively.

A first metal layer 530 made of a metallic material is formed above or attached to thin film 520 between diodes 260 and 270. First metal layer 530 forms second plate 258 (shown in FIG. 2) of AC coupled transmission line 250. A dielectric layer 540 made of a dielectric material is formed above first metal layer 530, and a second metal layer 550 is formed above dielectric layer 540. Second metal layer 550 forms first plate 255 (shown in FIG. 2) of AC coupled transmission line 250. Second metal layer 550 is further formed between AC coupled transmission line 250 and diodes 260 and 270 to connect diodes 260 and 270 to first plate 255 of AC coupled transmission line 250. Dielectric layer 540 serves to prevent DC frequencies from passing from first metal layer 530 to second metal layer 550.

Figure 6:
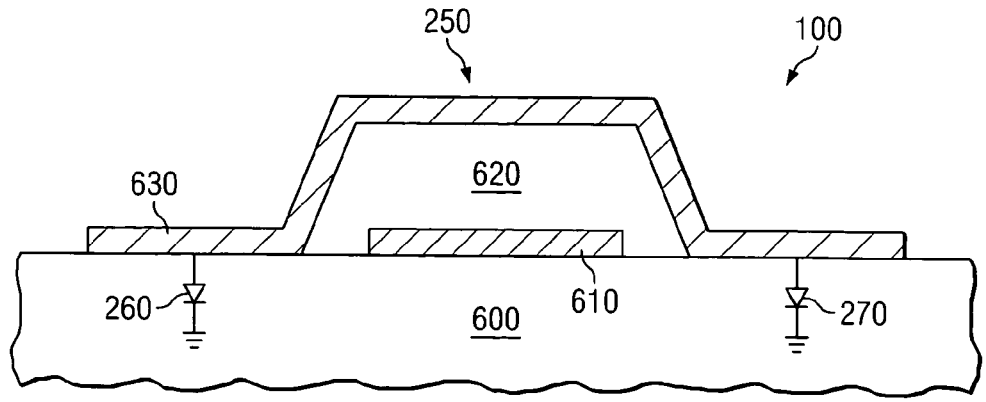
FIG. 6 is a cross-sectional view of the switch fabricated using an integrated circuit design.

FIG. 6 is a cross-sectional view of switch 100 fabricating using a semiconductor substrate 600. Diodes 260 and 270 are formed in semiconductor substrate 600, as is well-known in the art. A first metal layer 610 made of a metallic material is formed above substrate 600 between diodes 260 and 270. First metal layer 610 forms second plate 258 (shown in FIG. 2) of AC coupled transmission line 250. A dielectric layer 620 made of a dielectric material is formed above first metal layer 610, and a second metal layer 630 is formed above dielectric layer 620. Second metal layer 630 forms first plate 255 (shown in FIG. 2) of AC coupled transmission line 250. Second metal layer 630 is further formed between AC coupled transmission line 250 and diodes 260 and 270 to connect diodes 260 and 270 to first plate 255 of AC coupled transmission line 250. Dielectric layer 620 prevents DC frequencies from passing from first metal layer 610 to second metal layer 630.

Figure 7:
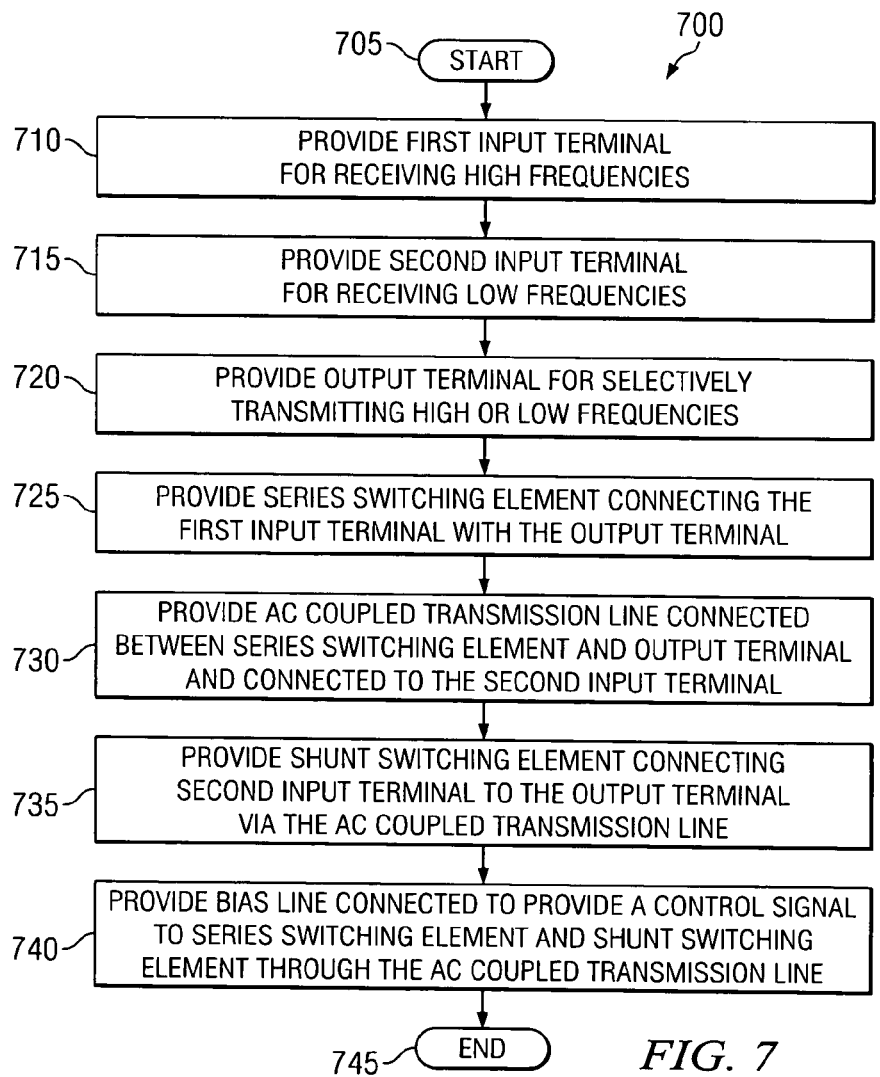
FIG. 7 is a flow chart illustrating an exemplary process for fabricating the switch, in accordance with embodiments of the present invention.

FIG. 7 is a flow chart illustrating an exemplary process 700 for fabricating the switch, in accordance with embodiments of the present invention. The process begins at step 705. At step 710, a first input terminal is provided for receiving a first input signal at a first frequency. For example, in one embodiment, the first frequency is a high frequency greater than or equal to 20 GHz. At step 715, a second input terminal is provided for receiving a second input signal at a second frequency. For example, in one embodiment, the second frequency is a low frequency between DC and 20 GHz. At step 720, an output terminal is provided for selectively transmitting the high or low frequencies.

At step 725, a series switching element is provided to electrically connect the first input terminal with the output terminal to provide the first input signal to the output terminal in a first state and isolate the first input terminal from the output terminal in a second state. At step 730, an AC coupled transmission line is electrically connected to the second input terminal and electrically connected between the series switching element and the output terminal.

At step 735, a shunt switching element is provided to electrically connect the second input terminal to the output terminal via the AC coupled transmission line in the second state and isolate the second input terminal from the output terminal in the first state. At step 740, a bias line is electrically connected to provide a control signal to the series switching element and the shunt switching element through the AC coupled transmission line to select between the first state and the second state. The process ends at step 745.

Figure 8:
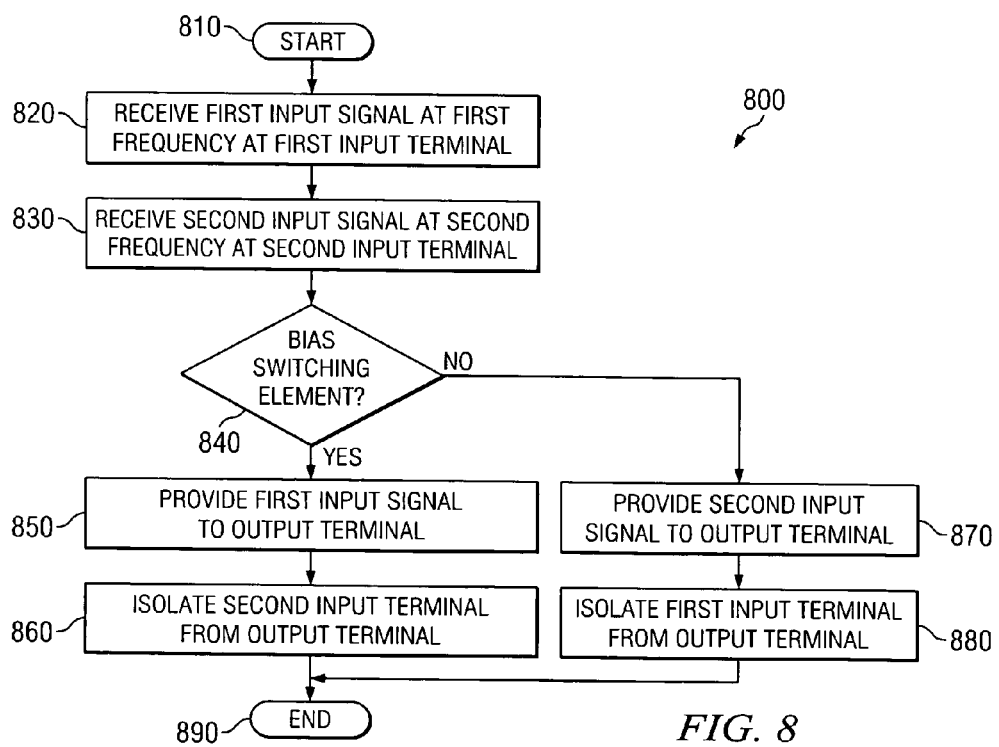
FIG. 8 is a flow chart illustrating an exemplary process for operating the switch, in accordance with embodiments of the present invention.

FIG. 8 is a flow chart illustrating an exemplary process 800 for operating the switch, in accordance with embodiments of the present invention. The process begins at step 810. At step 820, a first input signal at a first frequency is received at a first input terminal. At step 830, a second input signal at a second frequency is received at a second input terminal. If the switching element(s) are forward biased at step 840, the first input signal is provided to the output terminal at step 850, and the second input terminal is isolated from the output terminal at step 860. However, if the switching element(s) are reverse biased or zero biased at step 840, the second input signal is provided to the output terminal at step 870, and the first input terminal is isolated from the output terminal at step 880. The process ends at step 890.

As will be recognized by those skilled in the art, the innovative concepts described in the present application can be modified and varied over a wide rage of applications. Accordingly, the scope of patents subject matter should not be limited to any of the specific exemplary teachings discussed, but is instead defined by the following claims.

We claim:

1. A switch for selectively providing an input signal to an output terminal, comprising:
   a first input terminal receiving a first input signal at a first frequency;
   a second input terminal receiving a second input signal at a second frequency;
   a switching element coupling said first input terminal and said output terminal to provide said first input signal to said output terminal in a first state and isolating said first input terminal from said output terminal in a second state;
   a bias line providing a control signal to said switching element to select between said first state and said second state; and
   an AC coupled transmission line coupled to said second input terminal and coupled between said switching element and said output terminal, said control signal being provided through said AC coupled transmission line when said switching element is in said first state to isolate said second input terminal from said output terminal and provide said first input signal to said output terminal, said second input signal being provided DC coupled to said output terminal through said AC coupled transmission line when said switching element is in said second state.

2. The switch of claim 1, wherein said switching element is a series switching element.

3. The switch of claim 2, further comprising:
   a shunt switching element couple to said AC coupled transmission line, said control signal being provided to said shunt switching element through said AC coupled transmission line when said series switching element is in said first state, said control signal biasing said shunt switching element to isolate said second input terminal from said output terminal and provide said first input signal to said output terminal through said AC coupled transmission line.

4. The switch of claim 3, wherein said shunt switching element and said AC coupled transmission line are separated by a distance less than or equal to 70 μm.

5. The switch of claim 3, wherein said AC coupled transmission line is formed above a thin film attached to a ground plane and said shunt diode is formed adjacent said AC coupled transmission line and above said ground plane in an area having said thin film removed.

6. The switch of claim 3, wherein said AC coupled transmission line is formed above a semiconductor substrate and said shunt switching element is formed adjacent said AC coupled transmission line in said semiconductor substrate.

7. The switch of claim 3, wherein said shunt switching element comprises a first shunt switching element coupled to a first portion of said AC coupled transmission line coupled between said series switching element and ground through said first shunt switching element and a second shunt switching element coupled to a second portion of said AC coupled transmission line coupled between said output terminal and said second input terminal.

8. The switch of claim 7, wherein said series switching element, said first shunt switching element and said second shunt switching element are PIN diodes.

9. The switch of claim 7, wherein said series switching element, said first shunt switching element and said second shunt switching element are transistors.

10. The switch of claim 1, further comprising:
    a capacitive element coupled between said first input terminal and said switching element.

11. The switch of claim 10, wherein said capacitive element is a DC blocking capacitor.

12. The switch of claim 1, wherein said AC coupled transmission line is a capacitive element comprising a first plate and a second plate separated by a dielectric.

13. The switch of claim 12, wherein said first plate is comprised of a first metal layer and said second plate is comprised of a second metal layer.

14. The switch of claim 1, wherein said AC coupled transmission line is a quarter wavelength transmission line.

15. The switch of claim 1, wherein said bias line is a quarter wavelength bias line.

16. The switch of claim 1, further comprising a filter coupled between said second input terminal and said AC coupled transmission line.

17. A method for providing an input signal to an output terminal of a switch comprising a switching element and an AC coupled transmission line, said method comprising:
    receiving a first input signal at a first input terminal, said first input signal being at a first frequency;
    receiving a second input signal at a second input terminal, said second input signal being at a second frequency;
    providing said first input signal to said output terminal by biasing said switching element with a control signal, said control signal being provided through said switching element and said AC coupled transmission line to isolate said second input terminal from said output terminal; and
    providing said second input signal through said AC coupled transmission line to said output terminal when said control signal is not provided to said switching element.

18. The method of claim 17, wherein said providing said first input signal to said output terminal further comprises:
    biasing said switching element with said control signal to couple said first input terminal with said output terminal; and
    biasing a shunt switching element through said AC coupled transmission line to isolate said second input terminal from said output terminal.

19. The method of claim 18, wherein said providing said first input terminal to said output terminal further comprises:
    using a quarter wavelength transmission line as said AC coupled transmission line to make said shunt switching element appear as an open circuit to said first input signal and a short circuit to said second input signal.

20. A switching method, comprising:
    providing a first input terminal for receiving a first signal at a first frequency;
    providing a second input terminal for receiving a second signal at a second frequency;
    providing an output terminal for selectively transmitting said first signal and said second signal;

providing a series switching element coupling said first input terminal and said output terminal to provide said first input signal to said output terminal in a first state and isolating said first input terminal from said output terminal in a second state;

providing an AC coupled transmission line coupled to said second input terminal and coupled between said series switching element and said output terminal;

providing a shunt switching element coupling said second input terminal to said output terminal via said AC coupled transmission line in said second state and isolating said second input terminal from said output terminal in said first state; and providing a bias line to provide a control signal to said series switching element and said shunt switching element through said AC coupled transmission line to select between said first state and said second state.

21. The method of claim 20, wherein said providing said shunt switching element further comprises:

separating said shunt switching element and said AC coupled transmission line by a distance less than or equal to 70 μm.

22. The method of claim 20, wherein said providing said AC coupled transmission line includes forming said AC coupled transmission line above a thin film attached to a ground plane, and wherein said providing said shunt switching element includes forming said shunt switching element adjacent said AC coupled transmission line and above said ground plane in an area having said thin film removed.

23. The method of claim 20, wherein said providing said AC coupled transmission line includes forming said AC coupled transmission line above a semiconductor substrate, and wherein said providing said shunt switching element includes forming said shunt diode adjacent said AC coupled transmission line in said semiconductor substrate.

24. The method of claim 20, wherein said providing said shunt switching element includes providing a first shunt switching element coupled to a first portion of said AC coupled transmission line coupled between said series switching element and ground through said first shunt switching element and providing a second shunt switching element coupled to a second portion of said AC coupled transmission line coupled between said output terminal and said second input terminal.

25. The method of claim 20, further comprising:

providing a DC-blocking capacitive element coupled between said first input terminal and said switching element.

26. The method of claim 20, wherein said providing said AC coupled transmission line includes providing a first plate and a second plate separated by a dielectric.

27. The method of claim 26, wherein said providing said AC coupled transmission line includes forming a first metal layer, forming a dielectric above said first metal layer and forming a second metal layer above said dielectric.

28. The method of claim 20, wherein said providing said AC coupled transmission line includes providing a quarter wavelength transmission line.

29. The method of claim 20, wherein said providing said bias line includes providing a quarter wavelength bias line.

30. The method of claim 20, further comprising providing a filter coupled between said input terminal and said AC coupled transmission line.

\* \* \* \* \*

UNITED STATES PATENT AND TRADEMARK OFFICE
CERTIFICATE OF CORRECTION

PATENT NO. : 6,998,933 B1
APPLICATION NO. : 10/910414
DATED : February 14, 2006
INVENTOR(S) : Robertson et al.

It is certified that error appears in the above-identified patent and that said Letters Patent is hereby corrected as shown below:

Title Page, in field (75), under "Inventors", in column 1, line 1, delete "Rohnert Park," and insert - - Santa Rosa, - -, therefor.

In column 10, line 30, in Claim 30, after "said" insert - - second - -.

Signed and Sealed this

Fifteenth Day of August, 2006

JON W. DUDAS
*Director of the United States Patent and Trademark Office*